United States Patent [19]

Gazsi et al.

[11] Patent Number: 5,233,548
[45] Date of Patent: Aug. 3, 1993

[54] METHOD AND NETWORK CONFIGURATION FOR ATTAINING A CONTINUOUS VARIATION IN THE TRANSFER FUNCTION OF AN ADAPTIVE RECURSIVE NETWORK FOR PROCESSING DISCRETE-TIME SIGNALS

[75] Inventors: Lajos Gazsi; Dieter Brückman, both of Düsseldorf, Fed. Rep. of Germany

[73] Assignee: Siemens Aktiengesellschaft, Munich, Fed. Rep. of Germany

[21] Appl. No.: 888,473

[22] Filed: May 22, 1992

Related U.S. Application Data

[63] Continuation of Ser. No. 538,821, Jun. 15, 1990, abandoned.

[30] Foreign Application Priority Data

Jun. 15, 1989 [EP] European Pat. Off. ........... 89110896

[51] Int. Cl.[5] ............................................. G06F 15/31
[52] U.S. Cl. ................................................. 364/724.14
[58] Field of Search ..................... 364/724.14; 333/167

[56] References Cited

U.S. PATENT DOCUMENTS

| | | | |
|---|---|---|---|
| 3,919,671 | 11/1975 | Fettweis et al. | 364/724.14 |
| 3,967,099 | 6/1976 | Fettweis | 364/724.14 |
| 4,061,905 | 12/1977 | Fettweis | 364/724.14 |

OTHER PUBLICATIONS

IEEE Transactions on Circuits and Systems, vol. CAS-32, No. 1, Jan. 1985, pp. 68–88, New York, U.S.; L. Gazsi: "Explicit Formulas for Lattice Wave Digital Filter".
Circuit Theory and Design,—Proceedings of the 1981 European Conference on Circuit Theory and Design, Aug. 25-28, 1981, pp. 1052-1057, The Hague, NL; L. Gazsi: "Hardware Implemantation of Wave Digital Filters Using Programmable Digital Signal Processors".
IEEE Transactions on Acoustics, Speech, and Signal Processing, vol. ASSP-23, No. 6, Dec., 1975; Alfred Fettweis: "On Adaptors for Wave Digital Filters", pp. 516-525.

Primary Examiner—David H. Malzahn
Attorney, Agent, or Firm—Herbert L. Lerner; Laurence A. Greenberg

[57] ABSTRACT

A method and network configuration attain a continuous variation in the transfer function of an adaptive recursive network having multi-port subnetworks associated with parameters of the network, for processing discrete-time signals upon continuous variations in the parameters. The multi-port subnetworks are represented by elementary subnetworks being isolated with respect to the parameters. Each elementary subnetwork has parameters which can assume values in a given total value range being represented by a differently structured elementary subrange network being associated with adjacent value ranges of the respective parameter and having a transfer function varying continuously upon continuous variations in the parameter. A switchable inverter and elementary subnetworks having parameters which can only assume values in a range of the given total value range, are optionally represented by a combined subnetwork. The elementary subnetworks include first and second two-port adaptors each having first and second inputs and first and second outputs. A first adder is connected to the first and second inputs. A second adder is connected to the first input and the second output. A third adder is connected to the second input and the first output. A multiplier is connected between the output side of the first adder and the input sides of the second and third adders. The input side of the first adder of the first two-port adaptor is inverted with respect to the first input, and the input side of the third adder of the second two-port adaptor is inverted with respect to the multiplier.

11 Claims, 4 Drawing Sheets

$1 \geq \gamma_2 \geq 0$ $2 \geq \gamma_2 \geq 1$ $-1 \leq \gamma_1' \leq 0$

METHOD AND NETWORK CONFIGURATION FOR ATTAINING A CONTINUOUS VARIATION IN THE TRANSFER FUNCTION OF AN ADAPTIVE RECURSIVE NETWORK FOR PROCESSING DISCRETE-TIME SIGNALS

This application is a continuation of application Ser. No. 538,821, filed Jun. 15, 1990, now abandoned.

The invention relates to a method and a configuration in the form of a linear digital filter for attaining a continuous variation in the transfer function of an adaptive recursive network for processing discrete-time signals upon continuous variations in the parameters of the network, wherein the network includes multi-port sub-networks associated with the parameters and optional switchable inverters.

Adaptive networks, such as adaptive digital filters, are of major significance in many areas of discrete-time signal processing, particularly in the fields of systems analysis, echo compensation in two-wire/four-wire transitions, line distortion correction and speech processing. As compared with constant networks, a characteristic of such adaptive networks is that the network parameters that determine the transfer properties are optimally adjusted with respect to a Q function. A Q function of that kind is obtained, for instance, by minimizing the mean quadratic error of the output signal at the adaptive network with respect to a reference signal. For instance, in Optimization Theory with Applications (John Wiley and Sons, New York, 1969), D. A. Pierre discloses a method in which the partial derivations (gradient) of the Q function are formed in accordance with the network parameters to be adapted. For most quality criteria, that method can be ascribed to the formation of the partial derivations of the output signal of the adaptive network in accordance with the network parameters.

A method of that kind is described, for instance, in copending U.S. application Ser. No. 07/525,163, filed May 17, 1990 now U.S. Pat. No. 5,111,418. In that method, the partial derivations of the output signal of the adaptive network are calculated in accordance with various parameters with the aid of a gradient network.

Wave digital filters which are not only suitable for providing fixed transfer functions but are also excellently well suited for the implementation of adaptive systems, may be cited as a typical example of recursive networks for processing discrete-time signals. Wave digital filters include both delay means and adaptors. The adaptors are in turn made up of adders or subtracters as well as multipliers, in other words amplifiers. Various transfer functions can be set with the aid of the multiplier coefficients. With an adaptive wave digital filter, the multiplier coefficients represent the network parameters, which are variable and automatically adjust to the desired values. Gradient networks can also be constructed by means of wave digital filters.

In networks of that type, problems can occur in terms of the scaling, if the representable value range is given and if the numerical range is, for instance, limited to $-1 \leq \times 1 - 2^{-n}$ with the word length n (fixed point arithmetic). In order to attain the desired transfer functions, the modulation capacity of the network must remain within the defined range upon the variation of the parameters, which is dictated by the adaptive system, so that no saturation effects can arise. In order to prevent such undesirable characteristics, it is typical to scale the input signal of the network downward. As a rule, that results in a severe reduction of the input level. The consequence is a poor signal-to-noise ratio, which leads to noise upon quantization. The overall result is poor network dynamics. Other problems arise when positive or negative phase angle rotations are generated.

It is therefore desirable for such networks to provide different network structures for various value ranges of the network parameters. An article by L. Gazsi entitled "Explicit Formulas for Wave Digital Filters" in IEEE Transactions on Circuits and Systems, Vol. CAS-32, No. 1, pp. 68-88, January 1985, discloses different adaptor structures that permit optimal scaling in the applicable value range of the multiplier coefficient $\gamma$ for various value ranges of the coefficient of a two-port adaptor, while taking wave digital filters as an example.

Sudden changes in the value can occur at the network outputs at the transition from the structure associated with one value range of a parameter to a structure associated with another value range of the parameter, such as if the values of the parameter vary continuously. That becomes clear from FIG. 9 of the aforementioned article by L. Gazsi. As soon as $\gamma = 0$ is selected in the structure for the coefficient value $\gamma > 0$, the output of the left adaptor side is equivalent to the input of the right side, and the output of the right adaptor side is equivalent to the input of the left side. Then as soon as $\gamma = 0$ is selected in the structure for the filter coefficient $\gamma < 0$, the output of the left adaptor side is equivalent to the inverting input of the right side, and the output of the right adaptor side is equivalent to the inverting input of the left adaptor side. Such value changes can cause an abrupt jump in the differential or error signal on one hand, and they can cause instability of the entire adaptive system on the other hand.

Therefore, in networks of the type described initially above, which use different structures for various value ranges of the parameters or state variables, it must be assured that when there is a continuous variation in the parameters or state variables, the transfer function of the networks or the output signal of the network likewise varies continuously.

It is accordingly an object of the invention to provide a method and network configuration for attaining a continuous variation in the transfer function of an adaptive recursive network for processing discrete-time signals, which overcome the hereinafore-mentioned disadvantages of the heretoforeknown methods and devices of this general type and which provide a network configuration constructed as a 1 linear digital filter for performing the method.

With the foregoing and other objects in view there is provided, in accordance with the invention, a method for attaining a continuous variation in the transfer function of an adaptive recursive network including multi-port subnetworks associated with parameters of the network and optionally switchable inverters, for processing discrete-time signals upon continuous variations in the parameters, which comprises representing the multi-port subnetworks by elementary subnetworks being isolated with respect to the parameters; representing each elementary subnetwork having parameters which can assume values in a given total value range by a differently structured elementary subrange network being associated with adjacent value ranges of the respective parameter and having a transfer function varying continuously upon continuous variations in the parameter; and optionally subnetworks having parameters which can only assume values in range of the given total value range, by a combined subnetwork.

In accordance with another mode of the invention, there is provided a method which comprises associating each differently structured elementary subrange network with positive and network negative parameter values ranges. With the objects of the invention in view there is also provided a network configuration of a linear digital filter for attaining a continuous variation in the transfer function of an adaptive recursive network for processing discrete-time signals upon continuous variations in the parameters of the network, comprising multi-port subnetworks associated with the parameters and optionally switchable inverters, the multi-port subnetworks being in the form of elementary subnetworks being isolated with respect to the parameters, the elementary subnetworks including elementary subnetworks each having parameters assuming values in a given total value range in the form of differently structured elementary subrange networks being associated with adjacent value ranges of the respective parameter and having a transfer function varying continuously upon continuous variations in the parameter, the elementary subnetworks also optionally including elementary subnetworks having parameters only assuming values in a range of the given total value range and a switchable inverter forming a combined subnetwork together the elementary subnetworks having parameters only assuming values in a range of the given total value range, the elementary subnetworks including first and second two-port adaptors each having first and second inputs, first and second outputs, a first adder having an input side connected to the first and second inputs and having an output side, a second adder having an input side connected to the first input and an output side connected to the second output, a third adder having an input side connected to the second input and an output side connected to the first output, a multiplier connected between the output side of the first adder and the input sides of the second and third adders; the input side of the first adder of the first two-port adaptor being inverted with respect to the first input, and the input side of the third adder of the second two-port adaptor being inverted with respect to the multiplier.

In accordance with another feature of the invention, the elementary subnetwork having parameters only assuming values in a range of the given total value range is a three-port adaptor being closed off in a reflection-free manner.

In accordance with a concomitant feature of the invention, the first two-port adaptor is associated with positive multiplier coefficients for amplification factors and the second two-port adaptor is associated with negative multiplier coefficients for amplification factors.

It is an advantage of the invention that adaptive recursive networks for processing discrete-time signals which permit optimal scaling or positive or negative phase angle rotations can be formed at little expense. When the parameters of the network are varying continuously, the transfer function of the network varies continuously as well. In this way, sudden jumps in the error signal or instability of the adaptive system can be avoided, or at least greatly reduced.

Other features which are considered as characteristic for the invention are set forth in the appended claims.

Although the invention is illustrated and described herein as embodied in a method and network configuration for attaining a continuous variation in the transfer function of an adaptive recursive network for processing discrete-time signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 3A:
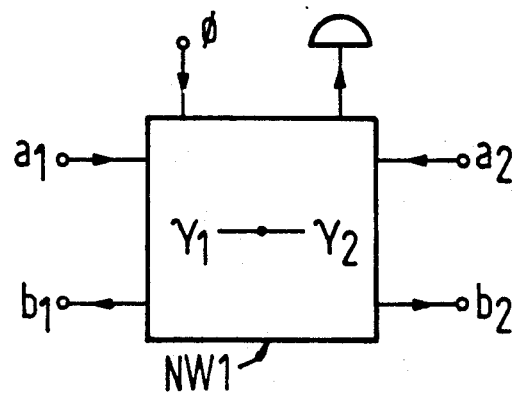
Figure 3B:
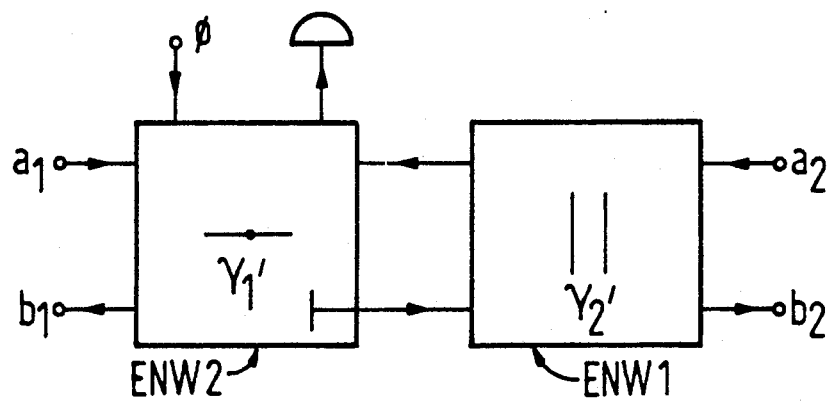
Figure 3C:
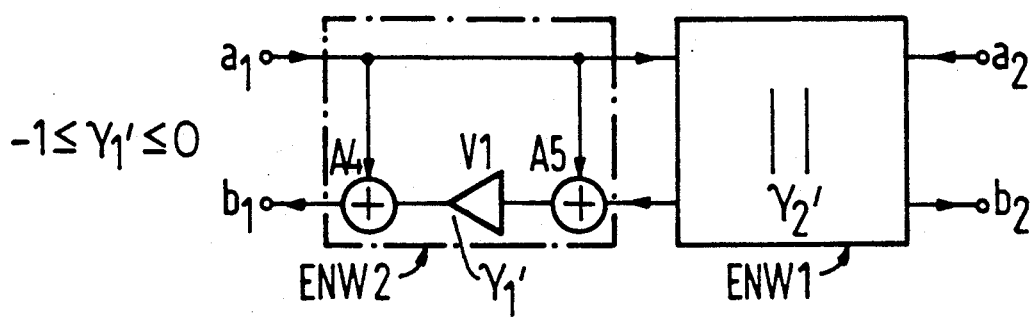
Figure 4A:
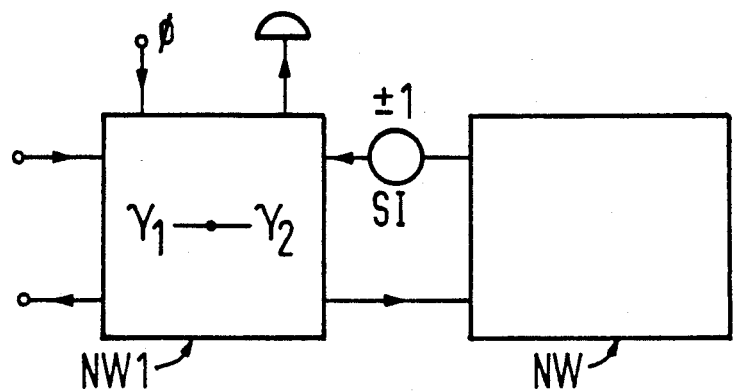
Figure 4B:
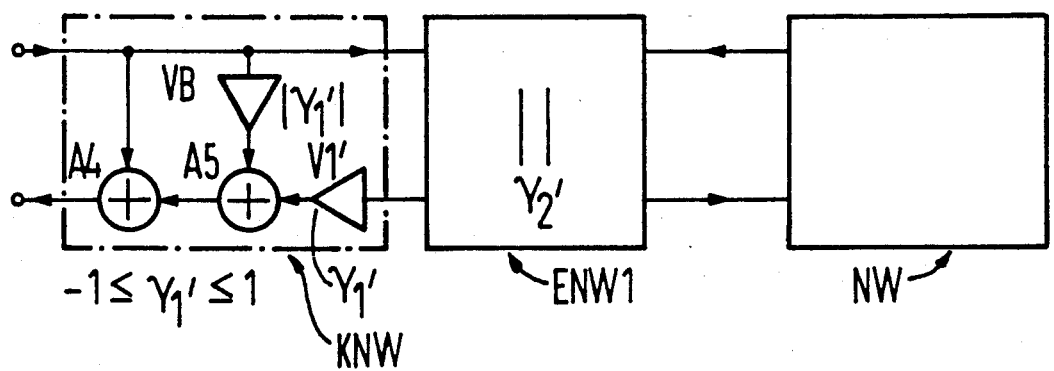

FIGS 3a—3c are a group of schematic and block circuit diagrams illustrating the steps of the method according to the invention for a multi-port subnetwork of FIG. 1; and FIGS. 4a, 4b are a group of schematic and block circuit diagrams illustrating the steps of the method according to the invention for a multi-port subnetwork of FIG. 1 with an additional switchable inverter.

Referring now in detail to the figures of the drawing as a whole, in which identical elements are identified by the same reference numerals, it is seen that in an adaptive recursive network for processing discrete-time signals, the basic concept of the invention is to split up multi-port subnetworks associated with state variables or parameters $\gamma_i$ initially into elementary subnetworks that are isolated with respect to the parameter $\gamma_i$, or in other words where each depends on only one parameter. Next, the elementary subnetworks that require different structures for different parameter ranges, such as for scaling reasons, are represented by elementary subrange networks with a different structure. This is based on the recognition that with continuous variations of the parameters of the network, a continuous variation in the transfer function of the network occurs if, as a sufficient condition, the output signals or transfer functions of the elementary subnetwork in which the particular parameter is embedded only vary continuously.

Figure 1A:
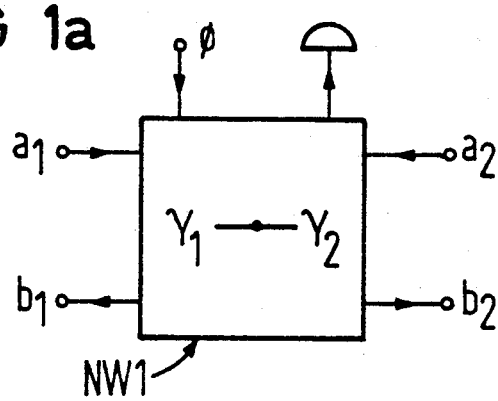
FIGS. 1a–1d are a group of schematic and block circuit diagrams showing the structure of a multi-port subnetwork of a linear digital filter in a given scaling range.
Figure 1B:
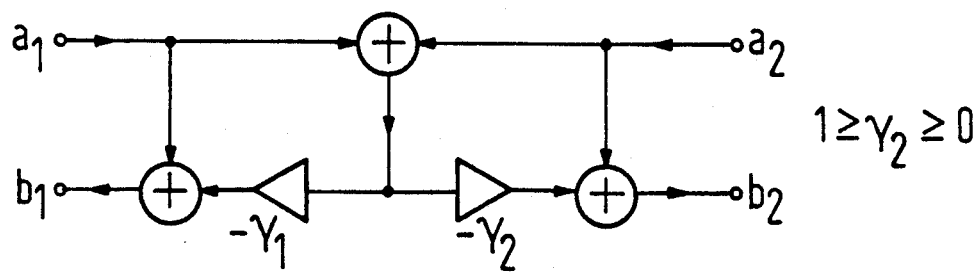

The point of departure taken by a first exemplary embodiment of the method according to the invention is a multi-port subnetwork, namely a three-port serial adaptor for an adaptive wave digital filter, which is terminated at a port with a resistor. FIG. 1a shows a symbolic circuit diagram for the three-port serial adaptor, which includes a subnetwork NWI having parameters $\gamma_1$ and $\gamma_2$. The first port is formed by a first input a1 and a first output b1; the second port is formed by a second input a2 and a second output b2; and the third port is formed by a third input $\phi$ and the third output a gate. Details of the construction of the three-port serial adaptor is shown in FIG. 1b, in which the adaptor has adders, as well as inverting amplifiers acting as multipliers with amplification factors of $-\gamma_1$ and $-\gamma_2$. It can be proved that for a given input signal, the output signal of the adaptor present at the second output b2 is correctly scaled if the parameter $\gamma_2$ is within the value range $0 \leq \gamma_2 \leq 1$.

Figure 1C:
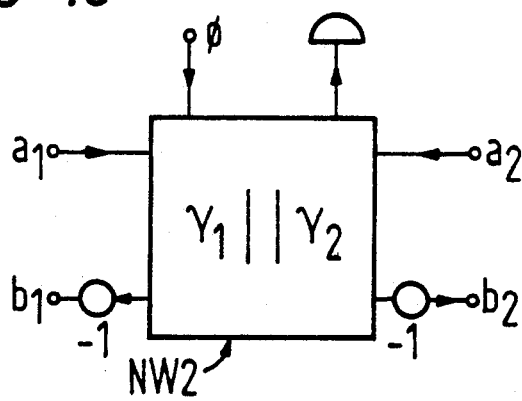
Figure 1D:
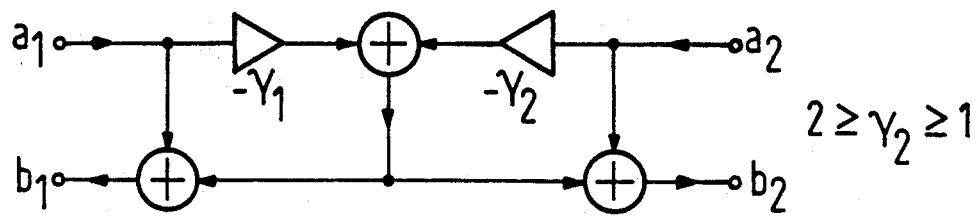

For scaling reasons, a three-port parallel adaptor must be selected for values of the parameter $\gamma_2$ greater than or equal to 1 and less than or equal to 2, as shown in FIGS. 1c and 1d. In the basic diagram of FIG. 1c, the three-port parallel adaptor includes a subnetwork NW2 and two inverters, each being connected upstream of a respective one of the two outputs. The structure of the subnetwork, which is correctly scaled in the value range $1 \leq \gamma_2 \leq 2$, can be seen from FIG. 1d. The switchover between the two structures must take place at the parameter value $\gamma_2 = 1$. From FIG. 1b, the following equations are obtained for the two outputs:

$$b_1 = a_1 \cdot (1-\gamma_1) - \gamma_1 \cdot a_2 \quad (1a)$$

$$b_2 = -a_1. \quad (1b)$$

Correspondingly, from FIG. 1d, the equations $$b_1 = a_1 \cdot (1-\gamma_1) - \gamma_1 - a_2 \quad (2a)$$

$$b_2 = -\gamma_1 \cdot a_1 \quad (2b)$$

are obtained. With direct construction of the three-port serial adaptor, it is accordingly not possible to assure a continuous variation in the transfer function when there is a continuous variation in the parameters of the subnetwork. As already noted, the same is true for the two-port adaptor structures that are well scaled within predetermined value ranges of the parameters.

Figure 2A:
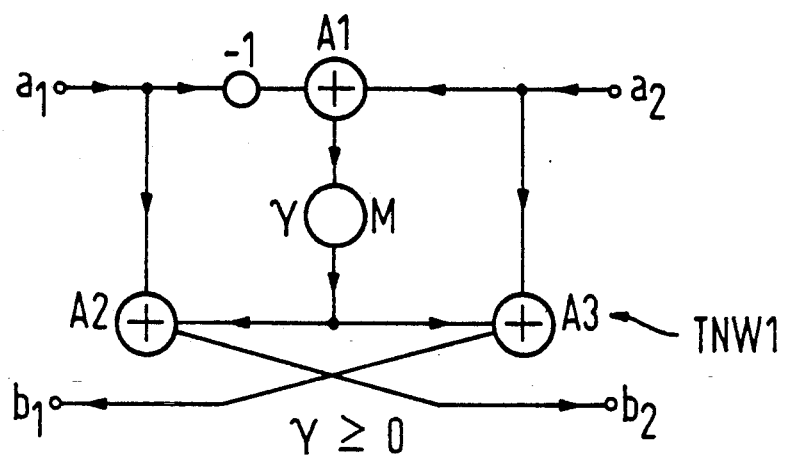
FIGS. 2a, 2b are a group of schematic circuit diagrams of an embodiment of a network configuration according to the invention.
Figure 2B:
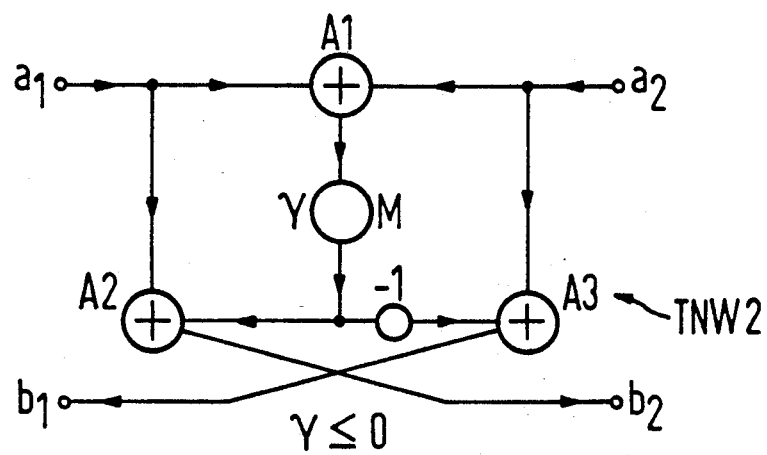

According to FIG. 2, the method according to the invention is based on elementary subrange networks with a different structure, the (resultant) transfer function of which likewise varies continuously, upon continuous variations in the parameter. In the exemplary embodiment of an adaptive wave digital filter, a two-gate adaptor according to FIG. 2 is an example of such elementary subrange networks of a different structure. First and second two-port adaptors TNW1 and TNW2 respectively shown in FIGS. 2a and 2b as schematic circuit diagrams, have a common feature which is that the first input $a_1$ is connected to a first adder A1 and to a second adder A2; the second input $a_2$ is connected to the first adder A1 and to a third adder A3; the output side of the first adder A1 is connected through a multiplier M to the second adder A2 and to the third adder A3; the output side of the second adder A2 is connected to the second output $b_2$; and the output side of the third adder A3 is connected to the first output $b_1$. In the first two-port adaptor TNW1, the first adder A1 has an inverting input with respect to the first input $a_1$, and in the second two-port adaptor TNW2, the third adder A3 has an inverting input with respect to the multiplier M.

It is known that the two-port adaptor structure of FIG. 2a is well scaled for parameter values $\gamma \geq 0$. On the other hand, the two-port adaptor structure of FIG. 2b permits good scaling for parameter values $\gamma \leq 0$. The system equations for the structure of FIG. 2a are as follows:

$$b_1 = \gamma \cdot (a_2 - a_1) + a_2, \gamma \geq 0 \quad (3a)$$

$$b_2 = \gamma \cdot (a_2 - a_1) + a_1, \gamma \geq 0 \quad (3b)$$

For the structure of FIG. 2b, the equations are as follows:

$$b_1 = -\gamma \cdot (a_2 + a_1) + a_2, \gamma \geq 0 \quad (4a)$$

$$b_1 = \gamma \cdot (a_2 + a_1) + a_1, \gamma \geq 0 \quad (4b)$$

The switchover between the two structures must take place at $\gamma = 0$, and it is evident that it is true for both structures that for $\gamma = 0$, the first output $b_1$ is equivalent to the second input $a_2$, and the second output $b_2$ is equivalent to the first input $a_1$. This means that upon a continuous variation in the parameter $\gamma$, the transfer function of the elementary subnetwork formed of the two elementary subrange networks of FIG. 2 likewise varies continuously. The method according to the invention will be described in conjunction with FIG. 3 by taking a point of departure as the elementary subrange networks of FIG. 2, which have been split into elementary subnetworks having parameters that can assume values in a given total value range. The three-port serial adaptor already described in regard to FIG. 1, which is terminated with a resistor at the output of the third port and the direct structure which is incapable of attaining the object of the invention, is represented in a first method step by elementary subnetworks that are isolated with respect to the parameters $\gamma_1$.

Elementary subnetworks of this kind are described as examples of wave digital filters in an article by A. Fettweiss and K. Meerkötter, entitled "On Adaptors for Wave Digital Filters", IEEE Transactions on Acoustic Speech Signal Processing, Vol. ASSP-23, pp. 516-525, December 1975. From the aforementioned article, it can be demonstrated that the three-port serial adaptor having the parameters $\gamma_1$ and $\gamma_2$, which is closed off at a port with a resistor, can be split into a simple two-port adaptor and a three-port serial adaptor being terminated at a gate in a reflection-free manner. The schematic diagram of FIG. 3b is thus obtained based on the structure of FIG. 3a. A simple two-port adaptor ENW1 then only depends on a parameter $\gamma_2'$ and can be constructed in accordance with the configuration according to the invention as shown in FIG. 2. A three-gate serial adaptor ENW2 which is terminated in a reflection-free manner depends on a parameter $\gamma_1'$, which is always positive, so that one structure is necessary for its construction, since the parameter $\gamma_1'$ can only assume values in a portion of the given total value range, namely $\gamma_1' \geq 0$.

FIG. 3 shows a schematic diagram of a structure of the three-port serial adaptor ENW2 which is closed off in a reflection-free manner. It includes two adders A4 and A5 and an inverting amplifier V1 with the amplification factor $\gamma_1'$. The first input leads to the two adders A4 and A5 and to the first input of the two-port adaptor ENW1. The second input is equivalent to the first output of the two-port adaptor ENW1 and leads to the adder A5, having an output which leads through the amplifier V1 to the adder A4. The output of the adder A4 is equivalent to the first output $b_1$ of the network ENW2.

In many of the adaptive networks on which the invention is based, especially in adaptive wave digital filters, it is necessary to provide algebraic sign (+ or −) reversers or inverters, which can be switched on and off. These switchable inverters are utilized, for instance, to make positive or negative phase angle rotations. It will be immediately apparent that a direct implementation of a switchable inverter does not permit any continuous transition of the filter output signal, or filter transfer function, so that sudden signal interference occurs.

As a rule, a switchable inverter o this kind, which may be necessary under some circumstances for scaling reasons, causes a signal jump upon a signal switchover. However, such a jump is undesirable, particularly in adaptive systems operating by the gradient process, because then the gradient cannot be formed. The method according to the invention provides for an optionally present switchable inverter to be combined with an elementary subnetwork, having a parameter which can only assume values with a range of the given total value range, to make a combined subnetwork. This will be explained in conjunction with a wave digital filter shown as an exemplary embodiment in FIG. 4.

FIG. 4a illustrates the method according to the invention by taking as an example the three-port serial adaptor NW1 already introduced in FIG. 1, which is terminated at a gate with a resistor, and a switchable inverter SI connected to the second input thereof. The switchable inverter SI is connected to the output side of a network NW, which has an input side that is in turn connected to the second output of the three-gate serial adaptor NW1. The structure of the network NW need not be described for the method according to the invention.

In accordance with the method steps according to the invention that are described in conjunction with FIG. 3, the three-port serial adaptor NW1 is first split up into the first two-port adaptor ENW1 and the three-port serial adaptor ENW2 which is terminated in a reflection-free manner. Next, the switchable inverter is combined with the three-port serial adaptor ENW2 that is terminated in a reflection-free manner, to make a combined subnetwork KNW, by means of a network transformation which is familiar to one skilled in the art. To this end, the amplifier V1 connected to the 1 output side of the adder A5 in FIG. 3c is first applied to the inputs of the adder. Next, the switchable inverter SI is "pushed through" by the two-port adaptor ENW1 and combined with the three-port serial adaptor ENW2 that is terminated in a reflection-free manner. The result is that an amplifier V1', which precedes the adder with respect to the second input, and has the amplification factor $\gamma_{1'}$ is still constructed as an amplifier, while an amplifier VB that precedes the adder A5 with respect to the first input $a_1$ is constructed as a quantity former with the amplification of the quantity of $\gamma_{1'}$. Whereas in the elementary subnetwork ENW2 of FIG. 3c the parameter $\gamma_{1'}$ could only assume values in a range of the given total value range, namely values from $\geq -1$ and $\leq 0$, the parameter $\gamma_{1'}$ for the combined subnetwork KNW can then assume values in the given total value range, that is the range of $-1 \leq \gamma_{1'} \leq 1$. In this way, the algebraic sign inverter is simultaneously provided. It is evident that upon continuous variations in the parameter $\gamma_{1'}$, a continuous variation of the filter output signal or transfer function takes place.

We claim:

1. Network configuration of a linear digital filter for attaining a continuous variation in the transfer function of an adaptive recursive network for processing time-discrete signals upon continuous variations in the parameters of the network, comprising multi-port subnetworks having assigned thereto respective parameters of the network, in the form of elementary subnetworks being isolated with respect to the parameters, said elementary subnetworks including further elementary subnetworks each having parameters assuming values within a given total value range in the form of differently structured elementary subrange networks having assigned thereto respective adjacent value ranges of the respective parameter and having a transfer function varying continuously upon continuous variations in the parameter, each of said further elementary subnetworks including first and second two-port adaptors each having first and second inputs, first and second outputs, a first adder having an input side connected to said first and second inputs and having an output side, a second adder having an input side connected to said first input and an output side connected to said second output, a third adder having an input side connected to said second input and an output side connected to said first output, a multiplier connected between the output side of said first adder and the input sides of said second and third adders, means for inverting the input side of said first adder of said first two-port adaptor with respect to said first input, and further means for inverting the input side of said third adder of said second two-port adaptor with respect to said multiplier.

2. Network configuration according to claim 1 including switch means having a switchable inverter, said further elementary subnetworks having parameters assuming values only within a range of the given total value range, said switchable inverter and said elementary subnetworks together forming a combined subnetwork having parameters assuming values only within a range of the given total value range.

3. Network configuration according to claim 2, wherein one of said further elementary subnetworks having parameters assuming values only in a range of the given total value range is a three-port adaptor having one port connected to a reflection-free termination.

4. Network configuration according to claim 1, including in said first two-port adaptor a multiplier for responding to positive amplification factors, and including in said second two-port adaptor a further multiplier for responding to negative amplification factors.

5. Network configuration of a linear digital filter for attaining a continuous variation in the transfer function of an adaptive recursive network for processing time-discrete signals upon continuous variations in the parameters of the network, comprising multi-port subnetworks associated with the parameters int he form of elementary subnetworks, means in said multi-port subnetworks for responding to said parameters, said elementary subnetworks including further elementary subnetworks each having parameters assuming values within a given total value range, and said further elementary subnetworks including first and second two-port adaptors each having first and second inputs, first and second outputs, a first adder having an input side connected to said first and second inputs and having an input side connected to said first and second inputs and having an output side, a second adder having an input side connected to said first input and an output side connected to said second output, a third adder having an input side connected to said secon input and an output side connected to said first output, a multiplier connected between the output side of said first adder and the input sides of said second and third adders; means for inverting the input side of said first adder of said first two-port adaptor being inverted with respect to said first input, and further means for inverting the input side of said third adder of said second two-port adaptor with respect to said multiplier.

6. Network configuration according to claim 5, including switching means having a switchable inverter, said further elementary subnetworks including elementary subnetworks having parameters assuming only values within a range of the given total value range, said switchable inverter and said elementary subnetworks together forming a combined subnetwork having parameters, said parameters assuming values only in a range of the given total value range.

7. Network configuration according to claim 6, wherein one of said elementary subnetworks having parameters assuming values only within a range of the given total value range, is a three-port adaptor being connected to a reflection-free termination.

8. Network configuration according to claim 5, including a multiplier in said first two-port adaptor corresponding to positive multiplier coefficients for amplification factors and a further multiplier in said second two-port adaptor for corresponding to negative multiplier coefficients for amplification factors.

9. Method for attaining a continuous variation in the transfer function of an adaptive recursive network having amplifiers being not switchable in their respective sign of amplification, said adaptive recursive network including at least one multi-gate subnetwork responsive to parameters of the network, for processing time-discrete signals upon continuous variation in the parameters, the method which comprises the steps of:
 a) forming elementary subnetworks from said multigate subnetwork, each of said elementary subnetworks being dependent on a single respective parameter; and
 b) forming a plurality of differently structured elementary subrange networks from said elementary subnetworks each having a parameter which can assume values within a given total value range, said elementary subrange networks being associated with adjacent value ranges of the respective parameter and having a transfer function varying continuously upon continuous variations in the respective parameter.

10. Method according to claim 12, which comprises assigning to each differently structured elementary subrange respective positive and negative parameter value ranges.

11. Method for attaining a continuous variation in the transfer function of an adaptive recursive network including at least one multi-gate subnetwork responsive to parameters of the network, for processing time-discrete signals upon continuous variations in the parameters, the method which comprises the steps of:
 a) forming elementary subnetworks from said multigate subnetwork each of said elementary subnetworks being dependant on a single respective parameter;
 b) forming a plurality of differently structured elementary subrange networks from said elementary subnetworks each having a parameter which can assume values within a given total value range, said differently structured elementary subrange networks being associated with adjacent value ranges of the respective parameter, and said elementary subrange networks having at transfer function varying continuously upon continuous variations in the respective parameter; and
 c) forming a combined subnetwork from an amplifier being switchable in its sign of amplification, one of said elementary subnetworks having a parameter which can assume values only within a range of the given total value range.

* * * * *